US010825782B2

(12) United States Patent
Dhakal et al.

(10) Patent No.: US 10,825,782 B2
(45) Date of Patent: Nov. 3, 2020

(54) SEMICONDUCTOR PACKAGES AND ASSOCIATED METHODS WITH SOLDER MASK OPENING(S) FOR IN-PACKAGE GROUND AND CONFORMAL COATING CONTACT

(71) Applicant: Micron Technology, Inc., Boise, ID (US)

(72) Inventors: Avishesh Dhakal, Meridian, ID (US); Gary A. Monroe, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/234,068

(22) Filed: Dec. 27, 2018

(65) Prior Publication Data

US 2020/0211975 A1     Jul. 2, 2020

(51) Int. Cl.
| | |
|---|---|
| *H01L 23/31* | (2006.01) |
| *H01L 23/552* | (2006.01) |
| *H01L 23/498* | (2006.01) |
| *H01L 21/78* | (2006.01) |
| *H01L 21/48* | (2006.01) |
| *H01L 21/56* | (2006.01) |

(52) U.S. Cl.
CPC ........ *H01L 23/552* (2013.01); *H01L 21/4853* (2013.01); *H01L 21/4857* (2013.01); *H01L 21/561* (2013.01); *H01L 21/565* (2013.01); *H01L 21/78* (2013.01); *H01L 23/3128* (2013.01); *H01L 23/3135* (2013.01); *H01L 23/49822* (2013.01); *H01L 23/49838* (2013.01)

(58) Field of Classification Search
CPC ............... H01L 23/552; H01L 21/4853; H01L 21/4857; H01L 21/561
USPC ........................................................ 257/659
See application file for complete search history.

(56) References Cited

U.S. PATENT DOCUMENTS

| | | | |
|---|---|---|---|
| 7,745,910 B1 * | 6/2010 | Olson .................... | H01L 21/561 257/659 |
| 8,093,691 B1 * | 1/2012 | Fuentes ............... | H01L 23/3128 257/659 |
| 8,102,032 B1 * | 1/2012 | Bolognia ............ | H01L 23/3128 257/659 |
| 8,508,023 B1 * | 8/2013 | Kelly ...................... | H01L 24/97 257/659 |
| 2010/0140759 A1 * | 6/2010 | Pagaila ................. | H01L 21/565 257/660 |

(Continued)

*Primary Examiner* — Sheikh Maruf
(74) *Attorney, Agent, or Firm* — Perkins Coie LLP (57) ABSTRACT

Semiconductor devices with a conformal coating in contact with a ground plane at a bottom side of the semiconductor devices and associated systems and methods are disclosed herein. In one embodiment, a semiconductor device includes a semiconductor die coupled to a first surface of a package substrate. The semiconductor device can also include a molded material covering at least a portion of the package substrate and the semiconductor die. The semiconductor device can also include a ground plane in the package substrate and exposed through an opening in a second surface of the package substrate opposite the first surface. The semiconductor device can also include a conformal coating coupled to the ground plane through the opening that can shield the semiconductor device from electromagnetic interference.

20 Claims, 10 Drawing Sheets

(56) References Cited

U.S. PATENT DOCUMENTS

| | | | |
|---|---|---|---|
| 2012/0133032 A1* | 5/2012 | Tsai | H01L 23/552 |
| | | | 257/659 |
| 2015/0102478 A1* | 4/2015 | Suthiwongsunthorn | |
| | | | H01L 24/45 |
| | | | 257/680 |
| 2016/0351509 A1* | 12/2016 | Dang | H01L 25/0655 |
| 2017/0077022 A1* | 3/2017 | Scanlan | H01L 23/49838 |
| 2017/0186726 A1* | 6/2017 | Tang | H01L 25/065 |
| 2017/0263572 A1* | 9/2017 | Gong | H01L 24/97 |
| 2018/0012857 A1* | 1/2018 | Lin | H01L 23/5381 |
| 2018/0026010 A1* | 1/2018 | Huang | H01L 25/0657 |
| | | | 257/659 |
| 2018/0138127 A1* | 5/2018 | Lee | H01L 23/3114 |
| 2018/0138130 A1* | 5/2018 | Lin | H01L 24/16 |
| 2019/0164895 A1* | 5/2019 | Kim | H01L 24/19 |
| 2019/0237406 A1* | 8/2019 | Choi | H01L 23/13 |
| 2019/0280374 A1* | 9/2019 | Kim | H01L 23/66 |
| 2019/0287924 A1* | 9/2019 | Moon | H01L 23/552 |
| 2019/0304887 A1* | 10/2019 | Ganesan | H01L 21/568 |
| 2019/0304936 A1* | 10/2019 | Shaul | H01Q 1/2283 |
| 2019/0385989 A1* | 12/2019 | Yu | H01L 21/6835 |
| 2020/0185815 A1* | 6/2020 | Lee | H01L 23/5383 |

\* cited by examiner

SEMICONDUCTOR PACKAGES AND ASSOCIATED METHODS WITH SOLDER MASK OPENING(S) FOR IN-PACKAGE GROUND AND CONFORMAL COATING CONTACT

TECHNICAL FIELD

The present disclosure generally relates to semiconductor devices. In particular, the present technology relates to semiconductor devices including semiconductor packages with solder mask openings for in-package ground and conformal coating contact, and associated systems and methods.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines.

Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact). For example, the small components, dies, and/or integrated circuitry of the microelectronic devices are often susceptible to electromagnetic interference (EMI). Thus, conformal coating of one or more conductive or magnetic materials can be applied over the top and sides of the microelectronic devices to provide electromagnetic shielding. Coating that reaches the bottom portion of the microelectronic devices is termed under-side deposition, back side spillage, or back spill.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

Specific details of several embodiments of semiconductor devices including semiconductor packages with solder mask openings for in-package ground and conformal coating contact, and associated systems and methods, are described below. In one embodiment, a semiconductor device includes a semiconductor die coupled to a first surface of a package substrate. The package substrate can include a ground plane exposed through an opening in a second surface of the package substrate opposite the first surface. In some embodiments, a molded material can cover at least a portion of the package substrate and the semiconductor die. A conformal coating can be applied over the molded material, the semiconductor die, and/or the package substrate to shield the semiconductor device from electromagnetic interference. A portion of the conformal coating can fill into the opening in the second surface of the package substrate and place the conformal coating into electrical connection with the ground plane through the bottom of the semiconductor device. As a result, ground traces and planes are not extended across saw streets at a strip level of the semiconductor devices, reducing the amount of metal a saw must cut through during singulation of the semiconductor devices.

Specific details of several embodiments of the present technology are described herein with reference to FIGS. 1-5. Although many of the embodiments are described with respect to semiconductor devices, systems, and methods with solder mask openings for in-package ground and conformal coating contact, other applications and other embodiments in addition to those described herein are within the scope of the present technology. Further, embodiments of the present technology can have different configurations, components, and/or procedures than those shown or described herein. Moreover, a person of ordinary skill in the art will understand that embodiments of the present technology can have configurations, components, and/or procedures in addition to those shown or described herein and that these and other embodiments can be without several of the configurations, components, and/or procedures shown or described herein without deviating from the present technology.

As used herein, the terms "vertical," "lateral," "upper," "lower," "top," and "bottom" can refer to relative directions or positions of features in the semiconductor devices in view of the orientation shown in the Figures. For example, "bottom" can refer to a feature positioned closer to the bottom of a page than another feature. These terms, however, should be construed broadly to include semiconductor devices having other orientations, such as inverted or inclined orientations where top/bottom, over/under, above/below, up/down and left/right can be interchanged depending on the orientation.

Figure 1A:
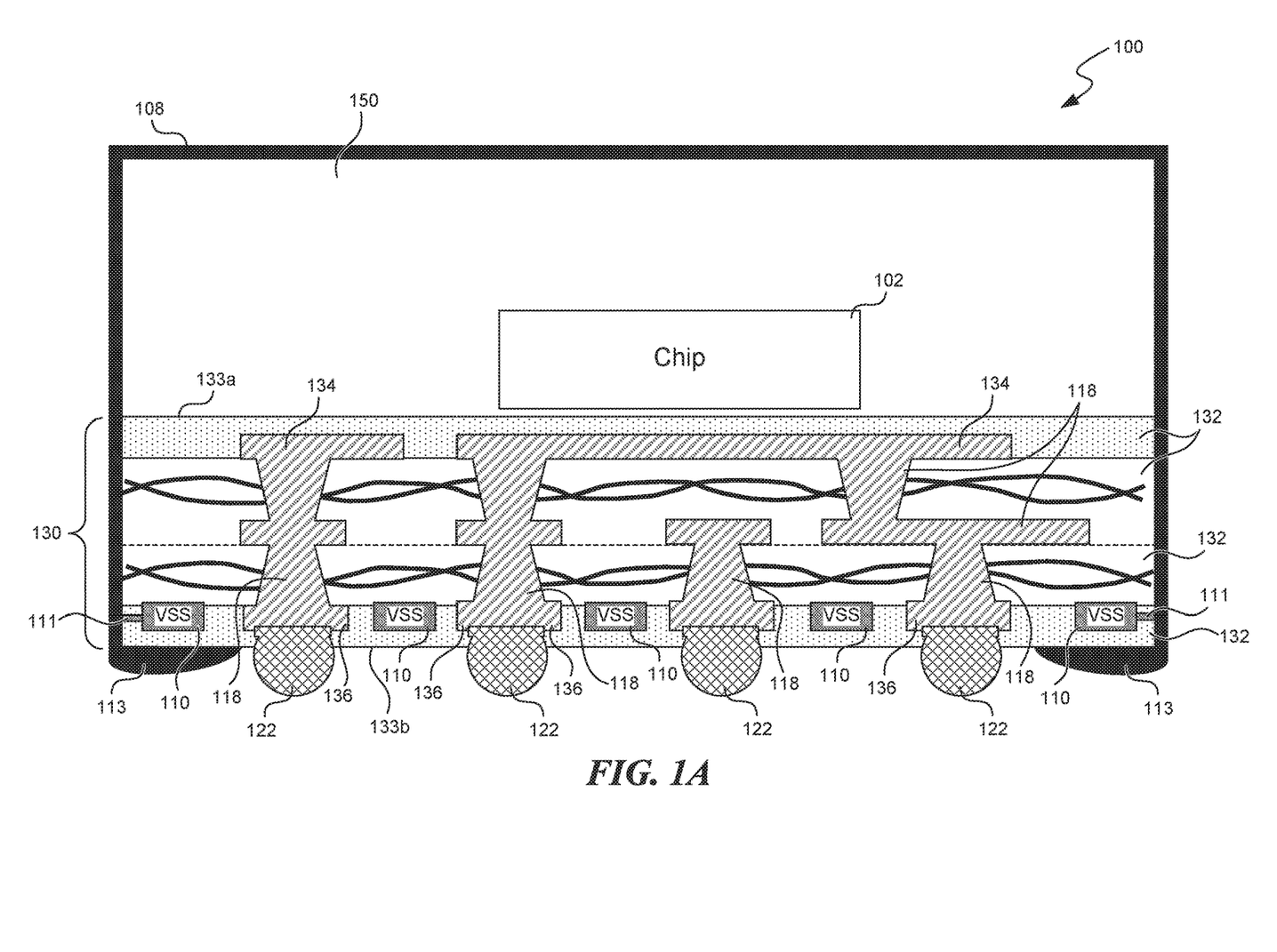
FIGS. 1A and 1B are a cross-sectional view and a back-plan view, respectively, illustrating a conventional semiconductor device with EMI shielding.
Figure 1B:
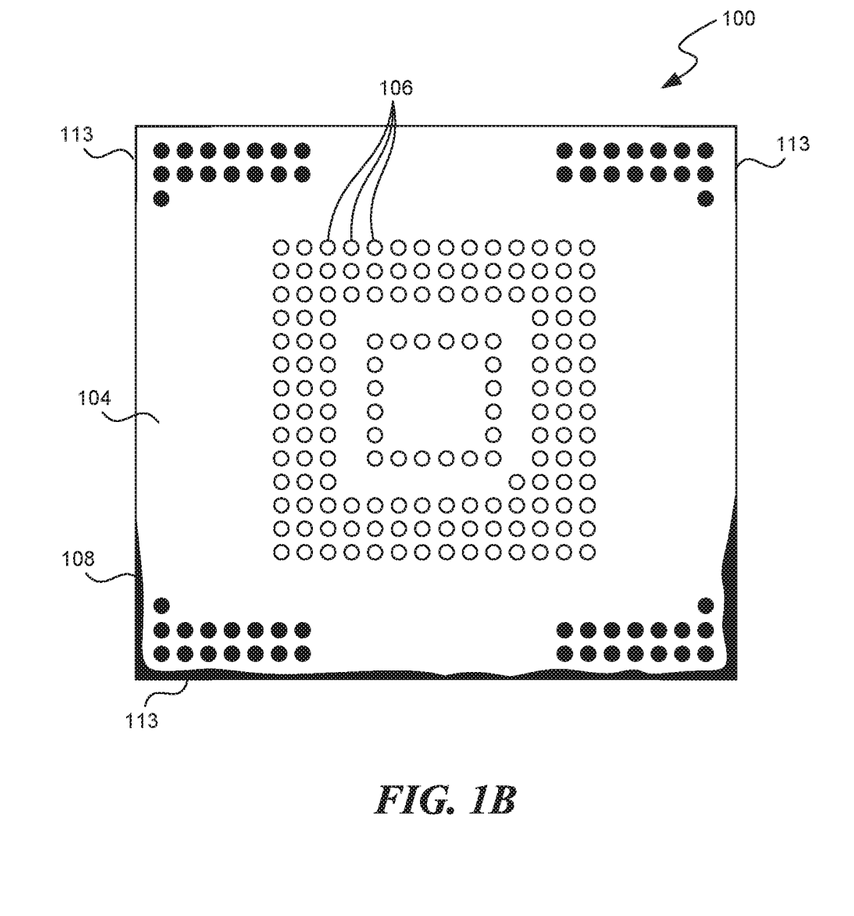

FIGS. 1A and 1B are a cross-sectional view and a back-plan view, respectively, illustrating a conventional semiconductor device 100 ("device 100") with an EMI shielding coating 108. With reference to FIG. 1A, the device 100 includes a package substrate 130, a semiconductor die 102 electrically coupled to the package substrate 130, and a molded material 150 over the package substrate 130 and the semiconductor die 102. The package substrate 130 includes substrates and/or dielectric materials 132, first contacts 134, and second contacts 136. The package substrate 130 further includes conductive lines 118 extending through the substrates and/or dielectric materials 132 to electrically couple the first contacts 134 to corresponding ones of the second contacts 136. The substrates and/or dielectric materials 132 electrically isolate individual first contacts 134, second contacts 136, and associated conductive lines 118 from one another. The package substrate 130 includes a first surface 133a that faces the semiconductor die 102 and a second surface 133b opposite the first surface 133a. The first contacts 134 can be exposed at the first surface 133a of the package substrate 130, and the second contacts 136 are exposed at the second surface 133b of the package substrate 130. The device 100 further includes a ground plane 110 within the package substrate 130. The ground plane 110 serves as a return path for current from various components in the device 100 and ensures that the ground connections of all components of the device 100 are at the same reference potential.

The device 100 further includes electrical connectors 122 disposed on the second surface 133b of the package substrate 130 and configured to electrically couple the second contacts 136 of the package substrate 130 to external circuitry (not shown). As shown in FIG. 1B, the second electrical connectors 122 are formed, at least in part, with a solder mask 104 to form a ball grid array (BGA) 106 on the second surface 133b of the package substrate 130.

The device 100, the semiconductor die 102, integrated circuitry within the semiconductor die 102, the conductive lines 118, the first contacts 134, the second contacts 136, and/or other components of the device 100 can be susceptible to electromagnetic interference (EMI). Thus, the ground plane 110 can be used to reduce electrical noise and interference between adjacent circuits and/or traces within and around the device 100. In this regard, the conformal coating 108 can be applied over the device 100 (e.g., over the molded material 150, the semiconductor die 102, and/or the package substrate 130) and can be coupled to the ground plane 110 to shield the device 100 from EMI. As shown in FIG. 1A, to facilitate the electrical connection between the ground plane 110 and the coating 108 in a conventional device 100, metal traces or stubs 111 are brought out from the ground plane 110 to the sides of the device 100 during a fabrication stage (not shown) of the package substrate 130. In other conventional devices (not shown), the ground planes 110 can be extended to the sides of the devices during the fabrication stage of the package substrate 130. In either implementation, a saw (not shown) must cut through the metal stubs 111 or the extended ground planes 110 during singulation of the conventional devices to expose the metal stubs 111 or the extended ground planes 110 at the sides of the conventional devices. This (i) can shorten the life of the saw blade and/or (ii) can result in burrs and/or non-uniform singulation cuts.

Furthermore, because the conformal coating 108 is often formed of one or more conductive or magnetic materials, the conventional intent of applying the conformal coating 108 is to obtain a continuous and/or uniform layer of coating 108 on the top and the sides of the conventional device 100 but no coating 108 on the bottom of the device 100 (e.g., at the second surface 133b of the package substrate). Coating 108 that reaches the bottom of the conventional device 100 can contact the electrical connectors 122 and/or the second contacts 136 and can cause damage to the device 100 and/or can cause the device 100 to malfunction (e.g., to short). Nevertheless, due to practical limitations of the coating process (e.g., of sputtering the coating 108 on the device 100), a portion 113 of the coating 108 often reaches the bottom of the device 100 (as shown in FIGS. 1A and 1B). This portion 113 of the coating 108 is termed under-side deposition, back side spillage, or back spill.

Figure 2A:
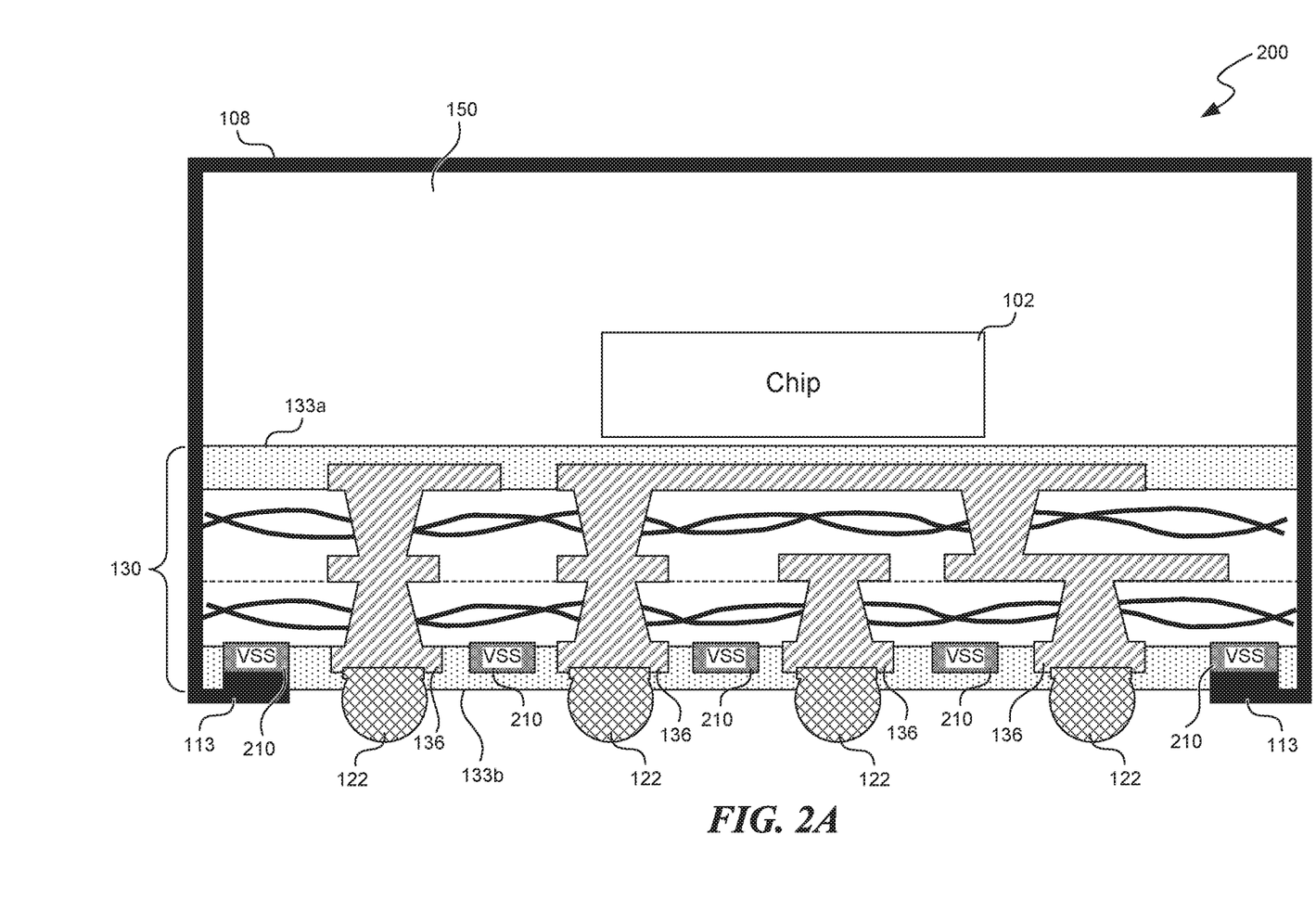
FIGS. 2A and 2B are a cross-sectional view and a back-plan view, respectively, illustrating a semiconductor device configured in accordance with various embodiments of the present technology.

FIG. 2A is a cross-sectional view of a semiconductor device 200 configured in accordance with various embodiments of the present technology. The device 200 is similar to the device 100 illustrated in FIGS. 1A and 1B. As shown in FIG. 2A, however, a ground plane 210 of the device 200 contacts the EMI coating 108 at the bottom of the device 200 (e.g., at or near the surface 133b of the package substrate 130). In this regard, a portion of the package substrate 130 has been removed to expose the ground plane 210 at the bottom of the device 200 such that the back-side spillage portion 113 of the conformal coating 108 is placed in contact with the ground plane 210.

Figure 2B:
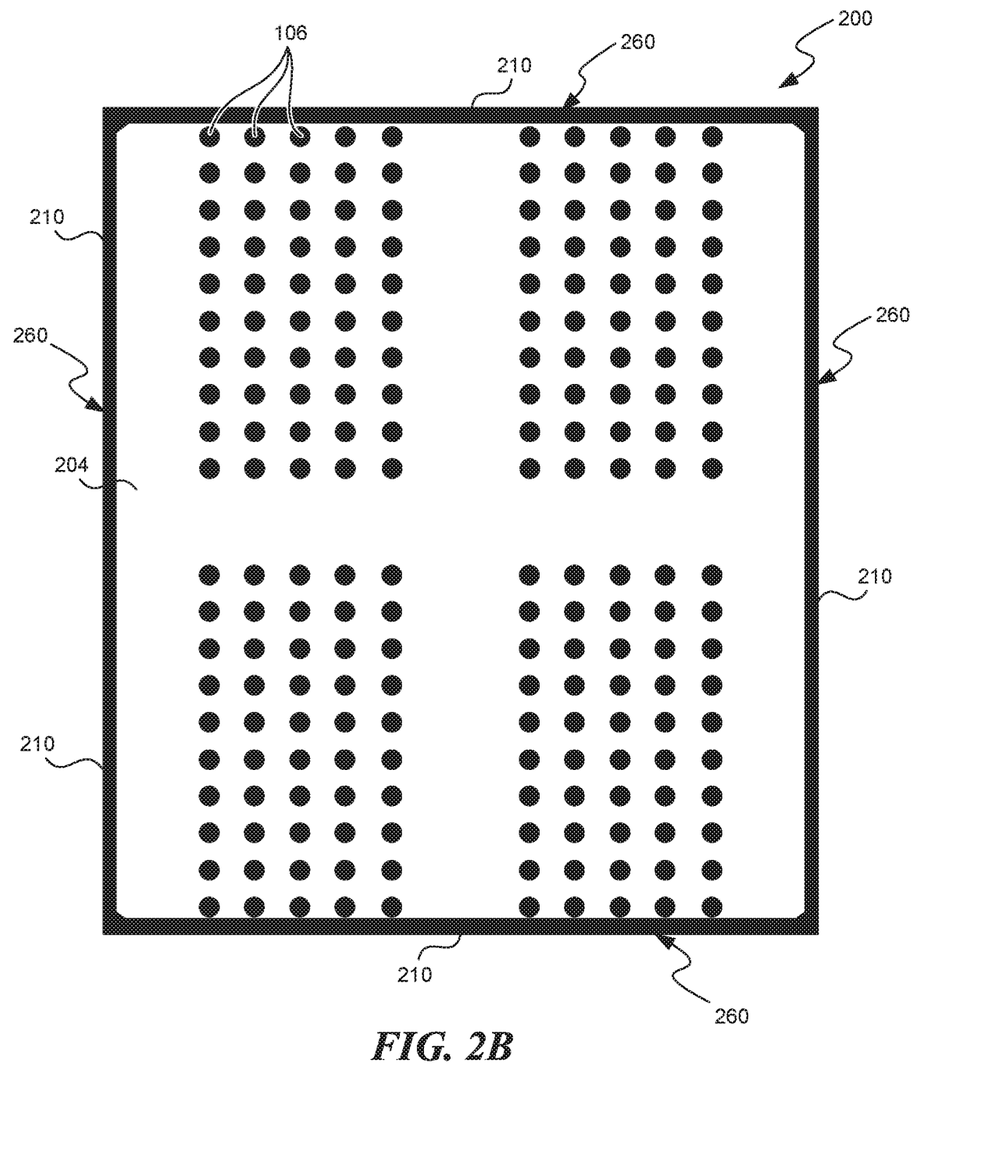

FIG. 2B is a back-plan view of the semiconductor device 200 illustrated in FIG. 2A during assembly of the device 200. As shown in FIG. 2B and described in greater detail below, a solder mask 204 can be applied over the second surface 133b of the package substrate 130. A plurality of openings (e.g., holes) can be etched into the solder mask 204 and/or into the package substrate 130, which can be filled with material (e.g., solder) to form a BGA 106 of electrical connectors 122 (FIG. 2A) connected to the second contacts 136 (FIG. 2A) on the bottom of the device 200. In addition, the solder mask 204 and/or the package substrate 130 can be etched (e.g., about the perimeter of the device 200) to form an opening 260 to expose the ground plane 210 through the package substrate 130 on the bottom of the device 200.

Referring to FIGS. 2A and 2B together, as the coating 108 is applied over the top and sides of the device 200, the back-side spillage portion 113 of the coating 108 can wrap around the bottom of the device 200 and contact the ground plane 210 through the opening 260. In some embodiments, the coating 108 can be applied before the solder mask 204 on the bottom of the device 200 is removed and/or before the electrical connectors 122 and/or the BGA 106 are formed. In these embodiments, the solder mask 204 can prevent the back-side spillage portion 113 of the coating 108 front contacting the electrical connectors 122 or the second contacts 136 on the bottom of the device 200.

As shown in FIG. 2A, in contrast with conventional devices, the ground plane 210 is not extended to the side of the device 200, nor are metal traces or stubs 111 (FIG. 1A) brought out from the ground plane 210 to the sides of the device 200. As a result, during singulation of the device 200, a saw does not cut through metal stubs 111 or through an extended ground plane 210 to expose metal at the sides of the device 200. Thus, a standard saw can be used and/or the lifespan of the saw can be lengthened or remain unchanged by the singulation process. Furthermore, the number of uniform singulation cuts and/or singulation cuts without burrs can increase. Moreover, standard singulation techniques used on devices (not shown) that do not require a conformal coating 108 can be applied to singulation of the device 200 with the conformal coating 108. Therefore, the cost of assembly and the assembly time are reduced (e.g., throughput is increased).

Figure 3A:
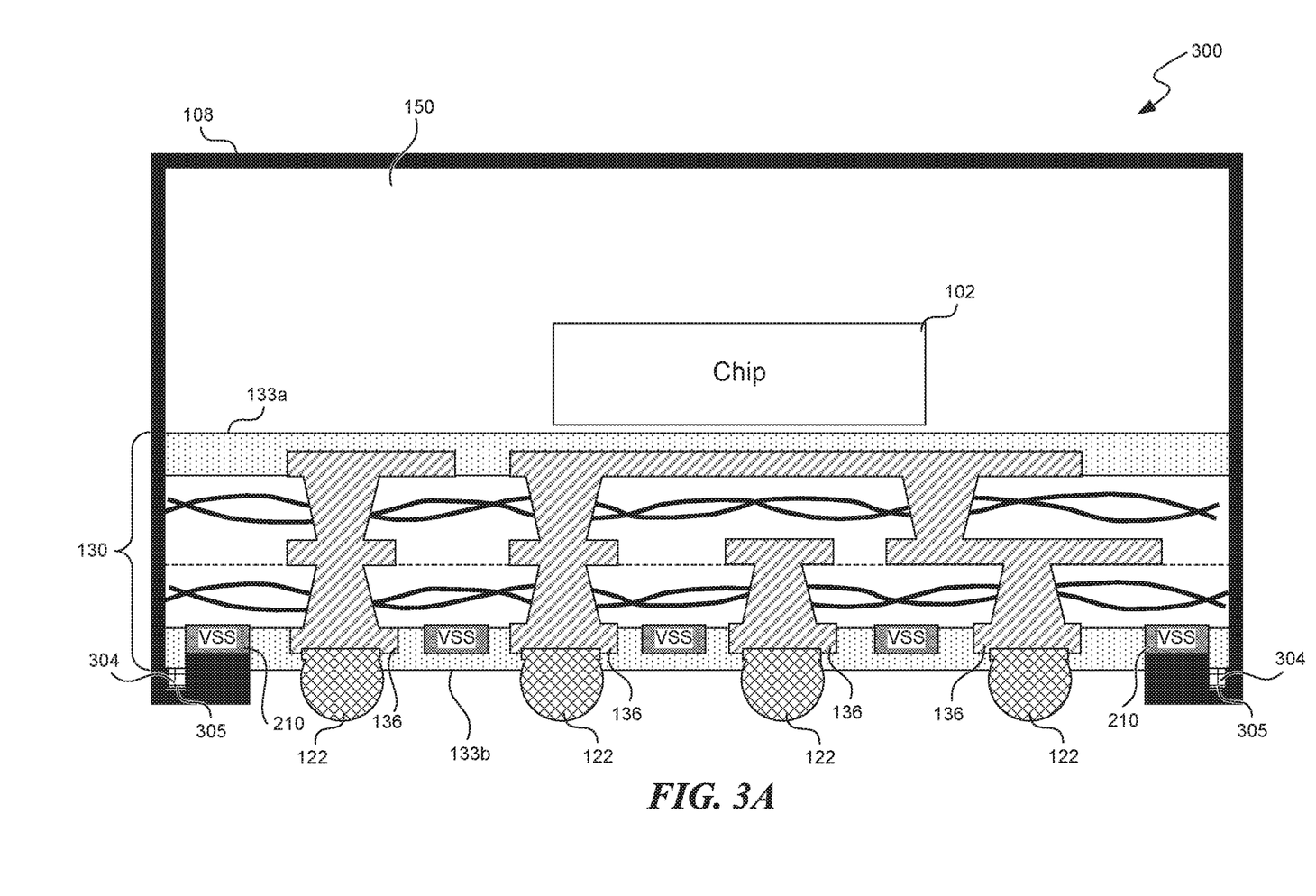
FIGS. 3A and 3B are a cross-sectional view and a back-plan view, respectively, illustrating a semiconductor device configured in accordance with various embodiments of the present technology.
Figure 3B:
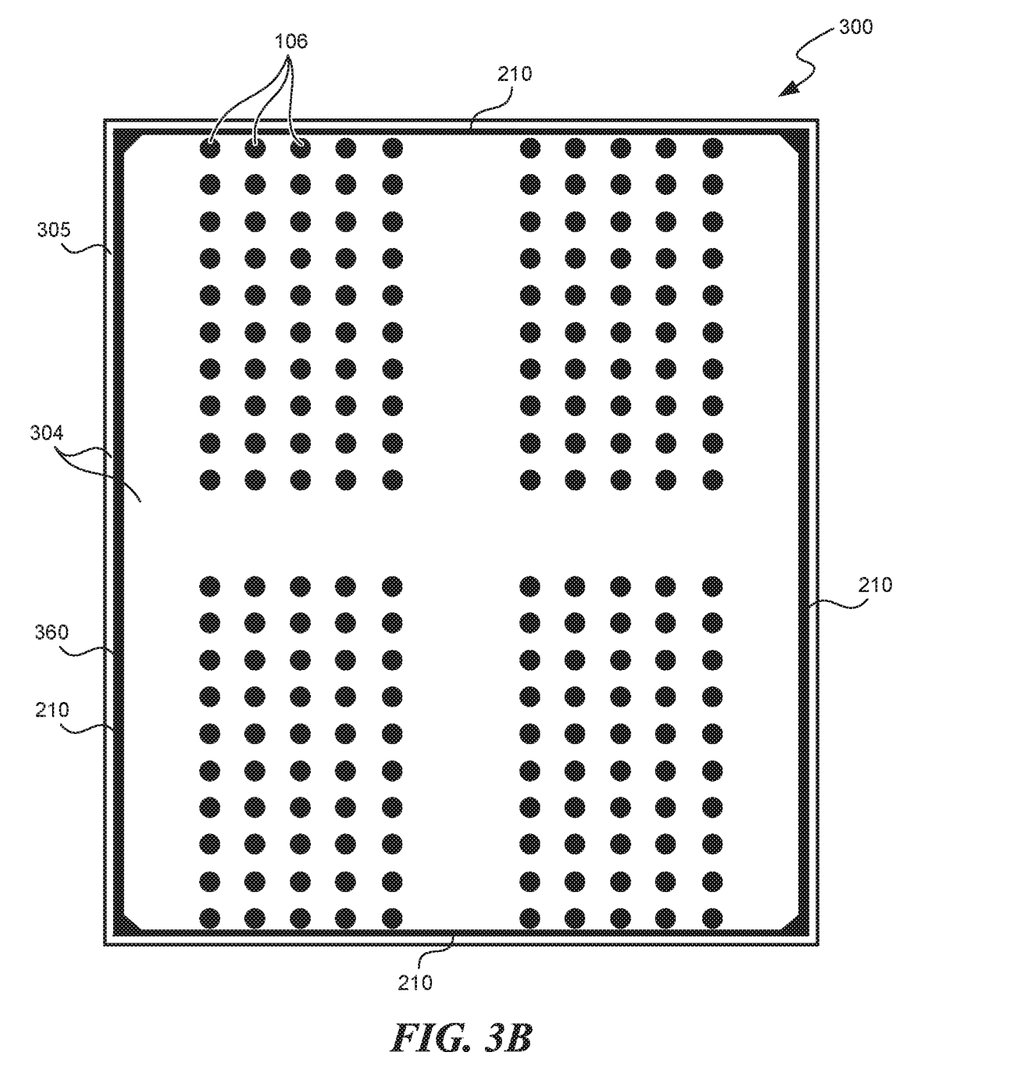

FIGS. 3A and 3B are a cross-sectional view and a back-plan view, respectively, illustrating a semiconductor device 300 configured in accordance with various embodiments of the present technology. The device 300 is similar to the device 200 illustrated in FIGS. 2A and 2B. As shown in FIG. 3A, however, a portion 305 of solder mask 304 remains on the fully assembled device 300 after the conformal coating 108 has been applied over the device 300 and placed into contact with the ground plane 210.

Referring to FIG. 3B, during assembly of the device 300, the solder mask 304 can be applied over the second surface 133b of the package substrate 130. A plurality of openings (e.g., holes) can be etched into the solder mask 304 and/or into the package substrate 130, which can be filled with material (e.g., solder) to form a BOA 106 of electrical connectors 122 (FIG. 3A) connected to the second contacts 136 (FIG. 3A) on the bottom of the device 300. In addition, the solder mask 304 and/or the package substrate 130 can be etched (e.g., about the perimeter of the device 300) to form an opening 360 to expose the ground plane 210 through the package substrate 130 on the bottom of the device 300. The opening 360 illustrated in FIG. 3B differs from the opening 260 illustrated in FIG. 2B in that the opening 360 is a trench or a moat bordered by the solder mask 304 on each side of the opening 360. In other words, when the opening 360 is formed, the portion 305 of the solder mask 304 remains (e.g., about the perimeter of the device 300).

Referring to FIGS. 3A and 3B together, as the coating 108 is applied over the top and sides of the device 300, the back-side spillage portion 113 of the coating 108 can wrap around the bottom of the device 300, fill into the opening 360, and contact the ground plane 210. In some embodiments, the coating 108 can be applied before the solder mask 304 on the bottom of the device 200 is removed and/or before the electrical connectors 122 and/or the BGA 106 are formed. In these embodiments, the solder mask 304 can prevent the back-side spillage portion 113 of the coating 108 from contacting the electrical connectors 122 of the second contacts 136 on the bottom of the device 300.

Although the solder masks 204 and 304 and/or the package substrates 130 of the devices 200 and 300 are etched to form openings 260 and 360 in the embodiments illustrated in FIGS. 2A-3B, a person of ordinary skill in the art will realize that other embodiments remain within the scope of the present technology. For example, metal traces or stubs (not shown) similar to the metal traces or stubs 111 (FIG. 1A) can be brought out from the ground plane 210 to the bottom of the devices 200 and/or 300 (e.g., to the second surface 133b of the package substrate 130). In other embodiments, the ground plane 210 can be extended to the bottom of the devices 200 and/or 300 (e.g., to the second surface 133b of the package substrate 130). In any of the above embodiments, the conformal coating 108 can be applied (i) before and/or after the solder masks 204 and/or 304 are removed from the bottom of the devices 200 and/or 300 and/or (ii) before and/or after the electrical connectors 122 and/or the openings for the BOA 106 are formed. In these and other embodiments, the openings 260 and/or 360 do not extend around the entire perimeter of the devices 200 and/or 300 and/or are formed on only a portion of the bottom of the devices 200 and/or 300.

Figure 4A:
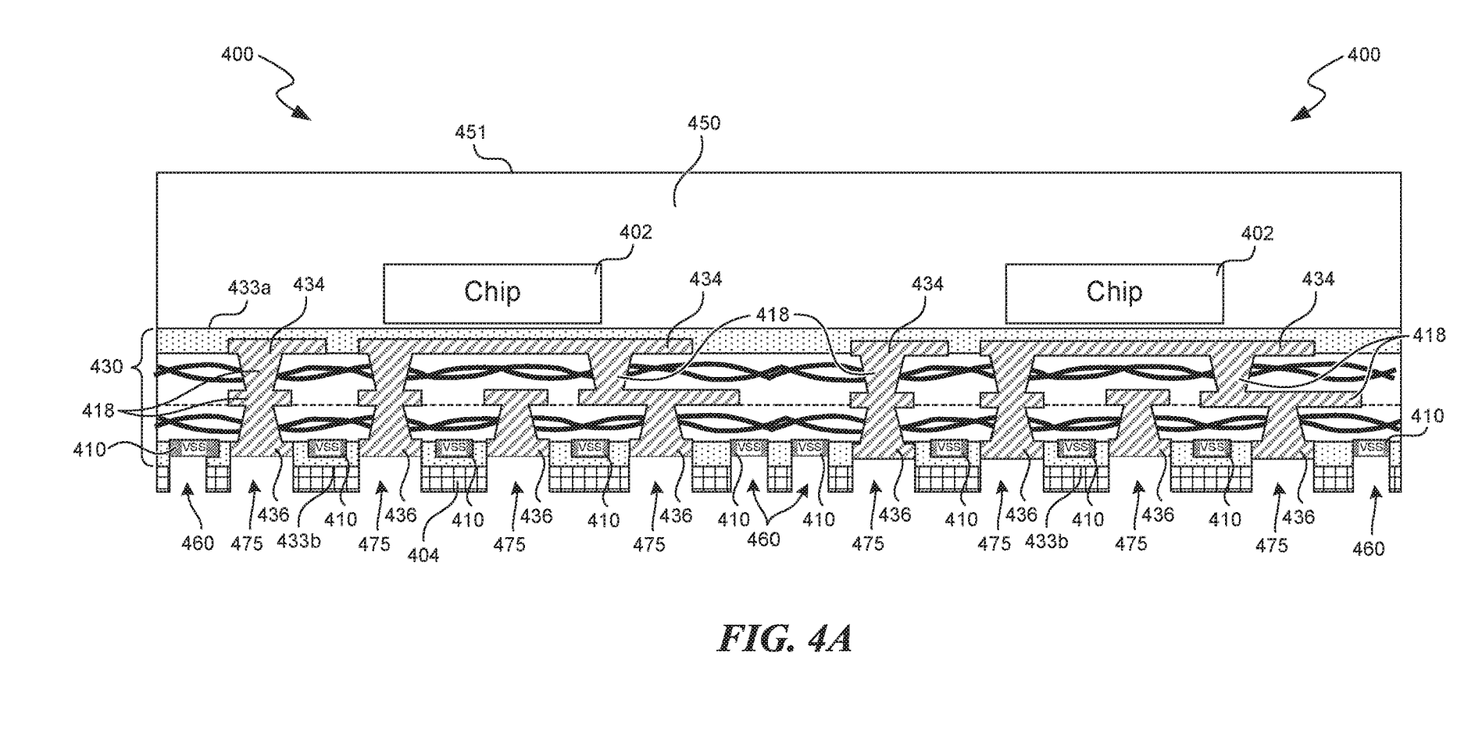
FIGS. 4A-4C are cross-sectional views illustrating a semiconductor device at various stages of manufacturing in accordance with various embodiments of the present technology.
Figure 4B:
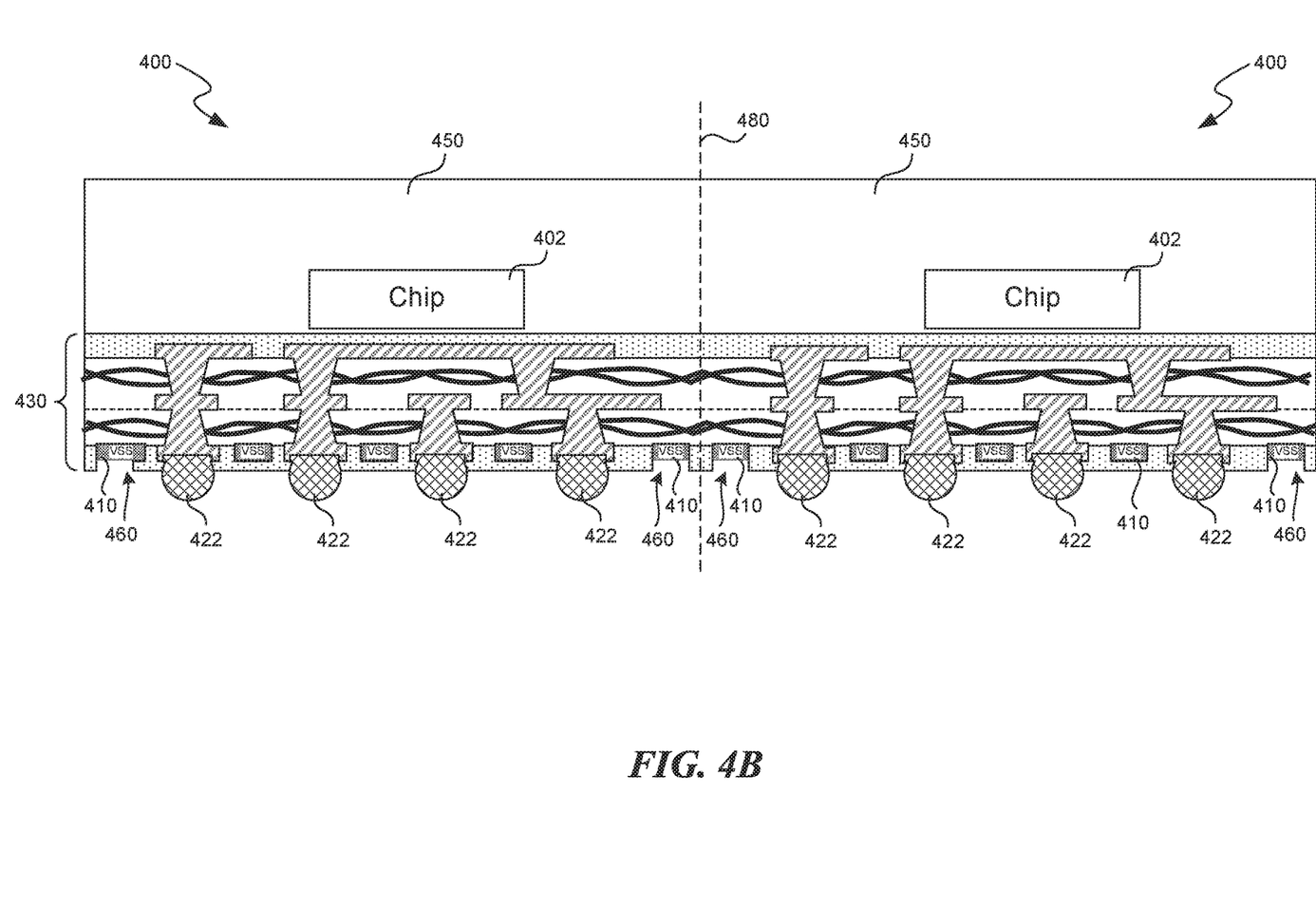
Figure 4C:
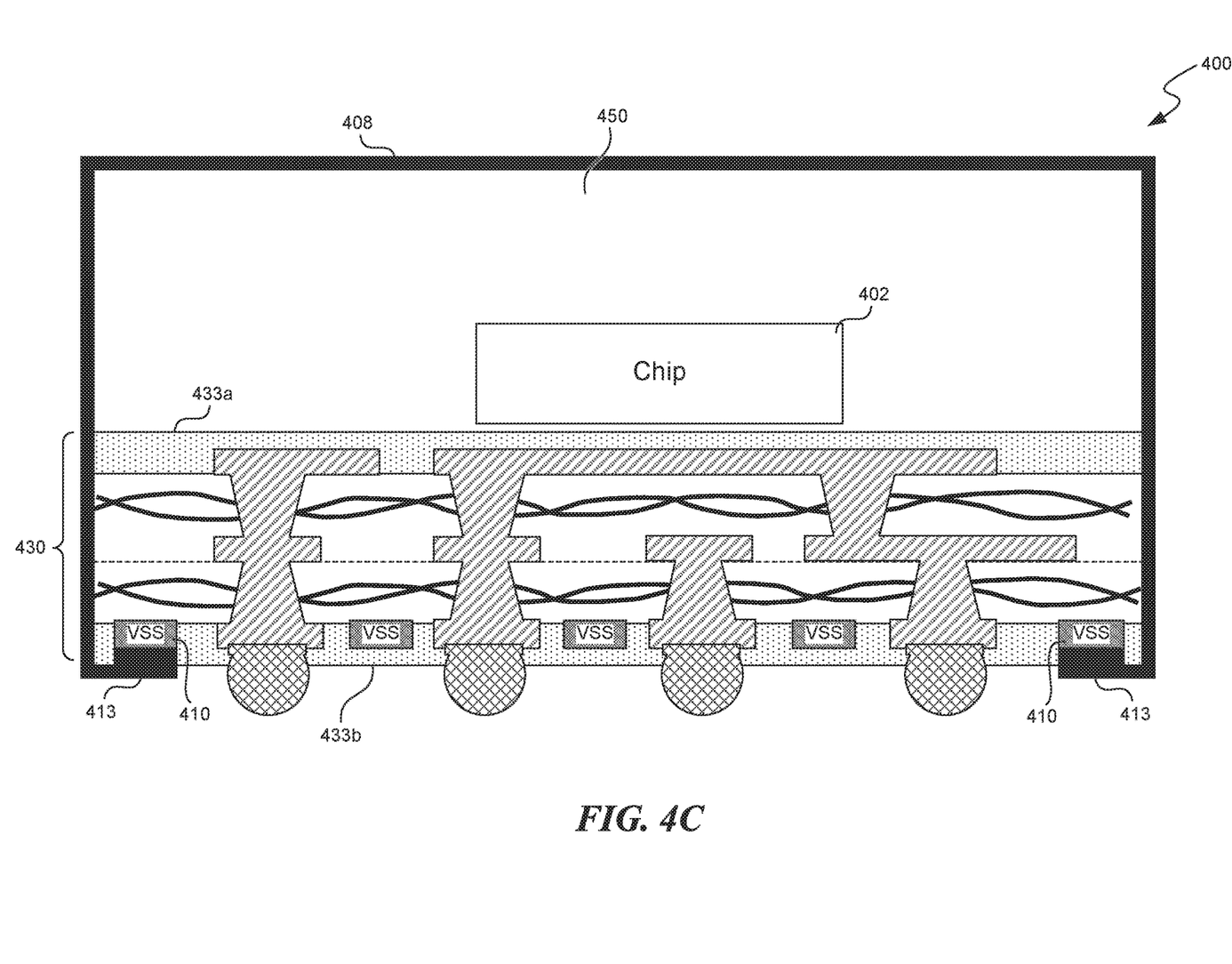

FIGS. 4A-4C are cross-sectional views illustrating a semiconductor device 400 at various stages of manufacturing in accordance with various embodiments of the present technology. Generally, the semiconductor device 400 can be manufactured, for example, as a discrete device or as part of a larger wafer or panel. In wafer-level or panel-level manufacturing, a larger semiconductor device is formed before being singulated to form a plurality of individual devices. For ease of explanation and understanding, FIGS. 4A-4C illustrate the fabrication of two semiconductor devices 400. However, one skilled in the art will readily understand that the fabrication of the semiconductor devices 400 can be scaled to the wafer and/or panel level—that is, to include many more components so as to be capable of being singulated into more than two semiconductor devices 400—while including similar features and using similar processes as described herein.

Fabrication of the semiconductor devices 400 can begin with formation of a package substrate. FIG. 4A illustrates the semiconductor devices 400 after a package substrate 430 is fully formed. As shown, a plurality of first contacts 434 are electrically coupled to conductive lines 418 (e.g., conductive vias and/or traces) extending within, through, and/or on the package substrate 430 to electrically couple individual ones of the first contacts 434 to corresponding ones of second contacts 436. The first contacts 434, the second contacts 436, and/or the conductive lines 418 can be made from copper, nickel, solder (e.g., SnAg-based solder), conductor-filled epoxy, and/or other electrically conductive materials. In some embodiments, the first contacts 434, the second contacts 436, and/or the conductive lines 418 are made front the same material. In other embodiments, the first contacts 434, the second contacts 436, and/or the conductive lines 418 may include more than one conductive material and/or can comprise different conductive materials from one another.

One or more ground traces and/or planes 410 extend within, through, and/or on substrates and/or dielectric materials 432 of the package substrate 430. The ground trace(s) and/or plane(s) 410 can be a large area of conductive material (e.g., copper) and can be coupled to a power supply ground terminal VSS. In certain embodiments, the ground trace(s) and/or plane(s) 410 can be a separate layer of the package substrate 430. In other embodiments, the ground trace(s) and/or plane(s) 410 can span multiple layers of the package substrate 430. The ground trace(s) and/or plane(s) 410 serve as a return path for current from various components in the devices 400 and ensure that the ground connection of all components of the devices 400 are at the same reference potential.

Fabrication of the semiconductor devices 400 continues with coupling a plurality of semiconductor dies 402 to die-attach areas of the package substrate 430. The semiconductor dies 402 can include various types of semiconductor components and functional features, such as dynamic random access memory (DRAM), static random access memory (SRAM), flash memory, or other forms of integrated circuit memory, processing circuitry, imaging components, and/or other semiconductor features. A back side of the semiconductor dies 402 (e.g., a side opposite a front side having bond pads (not shown)) is attached to a die-attach area at an exposed upper surface 433a of the package substrate 430. In FIG. 4A, none of the first contacts 434 are disposed within the die-attach area of the package substrate 430. In other embodiments, one or more of the first contacts 434 can be disposed within the die-attach area under the semiconductor dies 402.

The bond pads of the semiconductor dies 402 are electrically coupled to corresponding first contacts 434 of the package substrate 430 via electrical connectors (not shown). In some embodiments, the electrical connectors comprise a plurality of wire bonds. In other embodiments, the electrical connectors can comprise another type of conductive feature, such as conductive bumps, pillars, lead frames, etc. In these and other embodiments, the semiconductor dies 402 can be positioned face down such that the front side of each semiconductor die 402 faces the package substrate 430. In some embodiments, one or more additional semiconductor dies (not shown) can be stacked on the semiconductor dies 402 to form die stacks, and additional electrical connectors shown) can be formed to electrically couple the additional semiconductor dies to the package substrate 430. For example, the semiconductor dies 402 and the additional semiconductor dies can be stacked front-to-back, front-to-front, back-to-back, and/or back-to-front. Accordingly, a plurality of die stacks can be separated from each other along the package substrate 430. In some embodiments, a die stack can include a different number of semiconductor dies than another die stack. In these and other embodiments, the additional semiconductor dies can be stacked on the semiconductor dies 402 such that the semiconductor dies 402 are not directly below the additional semiconductor dies, and/or the additional semiconductor dies can have different dimensions or orientations from the semiconductor dies 402. For example, the additional semiconductor dies can be mounted such that they have a portion that overhangs the semiconductor dies 402, or the semiconductor dies 402 can be larger than the additional semiconductor dies such that the additional semiconductor dies are positioned entirely within a footprint of the semiconductor dies 402. In other embodiments, the additional semiconductor dies can be positioned adjacent the semiconductor dies 402 in a side-by-side arrangement.

In some embodiments, one or more of the second contacts 436 of the package substrate 430 are spaced laterally farther from the semiconductor dies 402 than the corresponding first contacts 434. That is, some of the second contacts 436 can be fanned out or positioned laterally outboard of the corresponding first contacts 434 to which they are electrically coupled. Positioning the second contacts 436 laterally outboard of the first contacts 434 facilitates connection of the devices 400 to other devices and/or interfaces having connections with a greater pitch than that of the semiconductor dies 402.

As shown in FIG. 4A, fabrication of the semiconductor devices 400 continues with forming a molded material 450 on the upper surface 433a of the package substrate 430 and around the semiconductor dies 402. In some embodiments, the molded material 450 can completely cover the semiconductor dies 402 and the package substrate 430. In the illustrated embodiment, the molded material 450 encapsulates the semiconductor dies 402 such that the semiconductor dies 402 are sealed within the molded material 450 and are protected from contaminants and physical damage. In some embodiments, the molded material 450 can also encapsulate some or all of the electrical connectors that connect the semiconductor dies 402 to corresponding first contacts 434 of the package substrate 430. The molded material 450 can provide structural strength to the device 400. For example, the molded material 450 can be selected to prevent the devices 400 from warping, bending, etc., as external forces are applied to the devices 400. The molded material 450 may be formed front a resin, epoxy resin, silicone-based material, polyimide, and/or other suitable resin used or known in the art. Once deposited, the molded material 450 can be cured by UV light, chemical hardeners, heat, or other suitable curing methods known in the art. The cured molded material 450 can include an upper surface 451.

Fabrication of the semiconductor devices 400 can continue with forming electrical connectors 422 (FIG. 4B) on the second contacts 436 (FIGS. 4A-4B). In this regard, a solder mask 404 can be applied to a bottom surface 433b of the package substrate 430 and etched to form a plurality of openings 475 through the solder mask 404 and/or through the package substrate 430. In some embodiments, the etching can expose the second contacts 436 through the package substrate 430 by removing a portion of the package substrate 430. In other embodiments, the second contacts 436 can be exposed by removal of the portion of the package substrate before applying and/or etching the solder mask 404 (e.g., during removal of a carrier substrate (not shown)). Solder and/or conductive epoxy can be filled into the plurality of openings 475. For example, a stenciling machine can deposit discrete blocks of solder paste onto the second contacts 436 of the package substrate 430.

As shown in FIG. 4A, the solder mask 404 can be etched to form a plurality of openings 460 to expose the ground trace(s) and/or plane(s) 410. In some embodiments, the solder mask 404 can be etched to form the plurality of openings 460 in addition to or in lieu of the plurality of openings 475. For example, the solder mask 404 can be etched to form the plurality of openings 460 before, after, and/or during etching of the solder mask 404 to form the plurality of openings 475. In some embodiments, the etching can expose the ground trace(s) and/or plane(s) 410 by removal of a portion of the package substrate 430. In other embodiments, the ground trace(s) and/or plane(s) 410 can be exposed by removal of the portion of the package substrate 430 before applying and/or etching the solder mask 404 (e.g., during removal of a carrier substrate (not shown)).

Referring to FIG. 4B, all or a portion of the solder mask 404 can be removed, and solder and/or conductive epoxy deposited onto the second contacts 436 through the plurality of openings 475 (FIG. 4A) can be used to form the electrical connectors 422. For example, solder can be reflowed to form a plurality solder balls or solder bumps to form a ball grid array. Alternatively, the deposited solder and/or conductive epoxy can be used to form conductive pillars, conductive lands, and/or other suitable electrically conductive elements (e.g., to form a land grid array). As discussed above, the electrical connectors 422 are configured to electrically couple the second contacts 436 of the package substrate 430 to external circuitry (not shown). In other embodiments, the electrical connectors 422 can be omitted, and the second contacts 436 can be directly connected to external devices or circuitry.

Fabrication can continue by singulating the semiconductor devices 400. As shown, the package substrate 430 can be cut together with the molded material 450 at a plurality of dicing lanes 480 (FIG. 4B) to separate the semiconductor devices 400 from one another. As discussed above, because the ground trace(s) and/or plane(s) 410 are exposed at the bottom of the devices 400, the ground trace(s) and/or plane(s) 410 do not extend to or across the dicing lanes 480. Nor are metal traces or stubs brought out from the ground trace(s) and/or plane(s) 410 to or across the dicing lanes 480, as is done in conventional devices. As a result, during singulation of the devices 400, a saw does not cut through the ground trace(s) and/or plane(s) 410 or through metal races and/or stubs extending from the ground trace(s) and/or plane(s) 410.

Referring to FIG. 4C, a conformal coating 408 can be applied over a singulated semiconductor device 400 to shield the device 400 from electromagnetic interference. For example, a sputtering process can be employed to apply (e.g., a continuous and/or uniform layer of) the coating 408 on the upper surface 451 of the molded material 450, the upper surface of the package substrate 430, and/or the sides of the semiconductor device 400. In other embodiments, the conformal coating 408 can be applied using other application techniques, such as plating, vacuum printing, vacuum deposition, insert molding, spray coating, and the like. The conformal coating 408 can be made from one or more conductive materials, such as Cu—Ni—Sn, Cu—Sn, Ni—Sn, Ag, stainless steel, and/or other conductive materials, including one or more electrically conductive polymers. As the coating 408 is applied over the top and sides of the device 400, a back-side spillage portion 413 of the coating 408 can reach the edges and/or bottom of the device 400. In these embodiments, the back-side spillage portion 413 of the coating 408 can wrap around to the bottom of the device 300, fill into the opening(s) 460, and contact the ground trace(s) and/or plane(s) 410. As a result, the coating 408 is placed in electrical contact with the ground trace(s) and/or plane(s) 410 through the opening(s) 460 and can provide EMI shielding to the device 400. Once fabrication is completed, the individual semiconductor devices 400 can be attached to external circuitry via, for example, the electrical connectors 422 and thus incorporated into a myriad of systems and/or devices.

Although the fabrication steps discussed above with respect to FIGS. 4A-4C are discussed and illustrated in a particular order, the fabrication steps are not so limited. In other embodiments, the fabrication steps can be performed in a different order. In these and other embodiments, any of the fabrication steps can be performed before, during, and/or after any of the other fabrication steps. For example, the plurality of openings 460 (FIGS. 4A and 4B) can be formed, and/or the coating 408 (FIG. 4C) applied, before the plurality of openings 475 are formed and/or filled with solder and/or conductive epoxy. In these and other embodiments, the semiconductor devices 400 can be singulated before the solder mask 404 is applied and/or etched. In these and still other embodiments, the coating 408 can be applied before all or a portion of the solder mask 404 is removed from the device 400. Furthermore, a person of ordinary skill in the art will readily recognize that the fabrication steps can be altered and still remain within these and other embodiments of the present technology. For example, one or more of the fabrication steps can be omitted and/or repeated in some embodiments. In these and other embodiments, fabrication of the semiconductor devices 400 can include additional fabrication steps. For example, a second solder mask (not shown) can be applied to the bottom of the device(s) 400 to form the plurality of openings 460 and/or to protect the electrical connectors 422 and/or the second contacts 436 during application of the coating 408. In these and still other embodiments, fabrication can include a finishing and/or polishing step (e remove burrs and/or unwanted coating 408).

Figure 5:
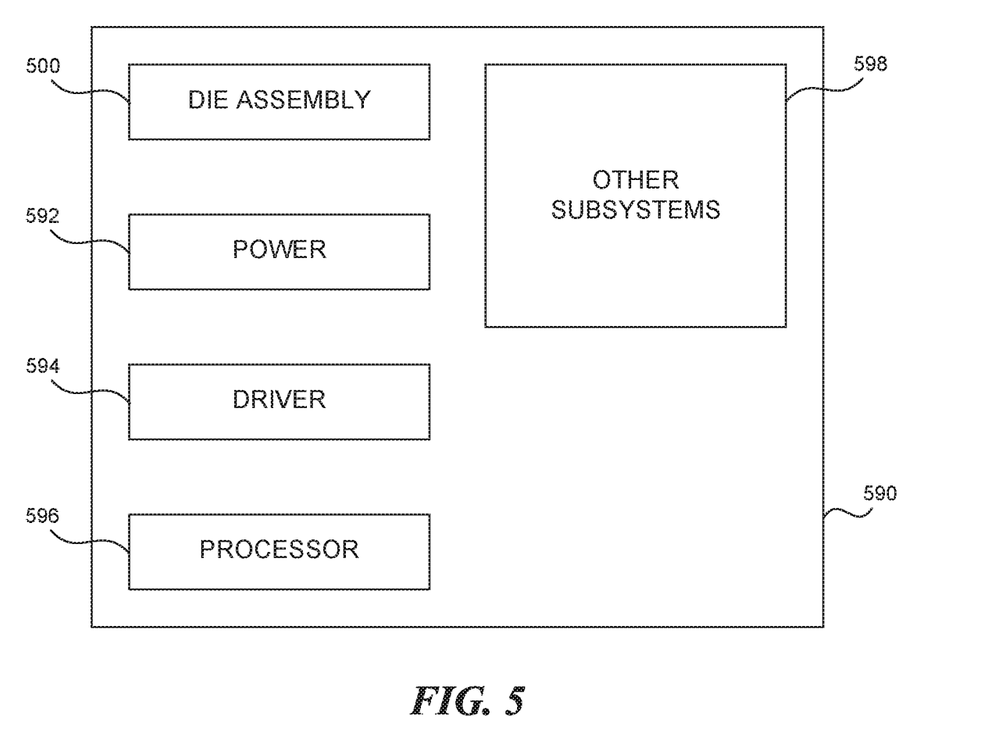
FIG. 5 is a schematic view of a system that includes a semiconductor device configured in accordance with an embodiment of the present technology.

Any one of the semiconductor devices described above with reference to FIGS. 1A-4C can be incorporated into any of a myriad of larger and/or more complex systems, a representative example of which is system 590 shown schematically in FIG. 5. The system 590 can include a semiconductor die assembly 500, a power source 592, a driver 594, a processor 596, and/or other subsystems or components 598. The semiconductor die assembly 500 can include semiconductor devices with features generally similar to those of the semiconductor devices described above. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, and appliances, Components of the system 590 may be housed in a single unit or distributed over multiple, interconnected units (e.g., through a communications network). The components of the system 590 can also include remote devices and any of a wide variety of computer-readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments can perform steps in a different order. Furthermore, the various embodiments described herein can also be combined ide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any materials incorporated herein by reference conflict with the present disclosure, the present disclosure controls. Where the context permits, singular or plural terms can also include the plural or singular term, respectively. Moreover, unless the word "or" is expressly limited to mean only a single term, exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

We claim:
1. A semiconductor device, comprising:
   a package substrate having a ground plane, a first surface having first conductive contacts, a second surface opposite the first surface having second conductive contacts, and conductive lines electrically coupling individual ones of the first conductive contacts to corresponding ones of the second conductive contacts;
   a semiconductor die coupled to the first surface of the package substrate;
   a molded material covering at least a portion of the package substrate and the semiconductor die; and
   a conformal coating electrically coupled to the ground plane through an opening in the second surface of the package substrate, wherein the conformal coating is configured to shield the semiconductor device from electromagnetic interference.

2. The semiconductor device of claim 1, wherein the ground plane is recessed within the opening in the second surface of the package substrate.

3. The semiconductor device of claim 2, wherein the conformal coating is electrically coupled directly to the ground plane.

4. The semiconductor device of claim 2, wherein the package substrate further includes a conductive trace that extends from the ground plane to the second surface of the package substrate, and wherein the conformal coating is electrically coupled to the ground plane via the conductive trace.

5. The semiconductor device of claim 4, wherein the conformal coating is electrically coupled to the conductive trace at the second surface of the package substrate.

6. The semiconductor device of claim 1, wherein the opening is a trench or moat, and wherein the semiconductor device includes solder mask between the package substrate and the conformal coating.

7. The semiconductor device of claim 1, wherein the opening extends around a perimeter of the package substrate.

8. The semiconductor device of claim 1, wherein—
the molded material includes a top surface;
the molded material and the package substrate include a plurality of side surfaces; and
the conformal coating coats the top surface and the plurality of side surfaces.

9. The semiconductor device of claim 1, further comprising a plurality of electrical connectors electrically coupled to the second conductive contacts.

10. The semiconductor device of claim 1, wherein the semiconductor die is a memory die.

11. A method of manufacturing a semiconductor device, the method comprising:
forming a package substrate, the package substrate including a ground plane, first conductive contacts at a first surface of the package substrate, and second conductive contacts at a second surface of the package substrate opposite the first surface, wherein the second conductive contacts are electrically coupled to corresponding ones of the first conductive contacts via conductive lines;
disposing a semiconductor die over the first surface of the package substrate;
forming a molded material over at least a portion of the first surface of the package substrate and the semiconductor die; and
applying a conformal coating over the molded material and the package substrate such that a portion of the conformal coating is electrically connected to the ground plane through an opening in the second surface of the package substrate.

12. The method of claim 11, further comprising, before applying the conformal coating, applying a solder mask over the second surface of the package substrate and etching the solder mask to expose the ground plane through the package substrate, the opening, and the solder mask.

13. The method of claim 12, wherein the etching of the solder mask includes forming the opening by removing a portion of the solder mask and a portion of the package substrate, and wherein the portion of the solder mask and the portion of the package substrate extend around a perimeter of the package substrate.

14. The method of claim 12, further comprising forming a plurality of electrical connectors, wherein individual ones of the plurality of electrical connectors are electrically connected to corresponding ones of the second conductive contacts of the package substrate.

15. The method of claim 12, wherein applying the conformal coating includes applying the conformal coating before removing the solder mask from over the package substrate.

16. The method of claim 12, further comprising removing the solder mask from over the package substrate before applying the conformal coating.

17. The method of claim 11, wherein applying the conformal coating includes applying the conformal coating over (i) a top surface of the molded material opposite a surface of the molded material that contacts the first surface of the package substrate and (ii) a plurality of side surfaces of the molded material and the package substrate.

18. The method of claim 11, further comprising forming a trace in the package substrate extending from the ground plane to the second surface of the package substrate, wherein the portion of the conformal coating contacts the trace at the second surface of the package substrate.

19. A semiconductor device package, comprising:
a semiconductor die;
a package substrate in electrical connection with the semiconductor die, wherein—
the package substrate includes—
a first side having first bond pads;
a second side opposite the first side having package contacts;
conductive lines electrically connecting individual ones of the first bond pads to corresponding ones of the package contacts; and
a ground plane exposed in an opening in the second side of the package substrate, and
the first side of the package substrate is attached to the semiconductor die; and
a conformal coating over the semiconductor die and the package substrate, wherein the conformal coating is electrically connected to the ground plane through the opening in the second side of the package substrate.

20. The semiconductor device package of claim 19, wherein the
opening extends around a perimeter of the package substrate.

* * * * *